(12) United States Patent
Chen et al.

(10) Patent No.: US 6,323,105 B1
(45) Date of Patent: Nov. 27, 2001

(54) METHOD FOR FABRICATING AN ISOLATION STRUCTURE INCLUDING A SHALLOW TRENCH ISOLATION STRUCTURE AND A LOCAL-OXIDATION ISOLATION STRUCTURE

(75) Inventors: Coming Chen, Taoyuan Hsien; Tony Lin, Kao Hsiung Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/188,822

(22) Filed: Nov. 9, 1998

(51) Int. Cl.$^7$ ................................................... H01L 21/76
(52) U.S. Cl. ..................... 438/430; 438/431; 438/439; 438/445; 438/448
(58) Field of Search .................................. 438/430, 431, 438/439, 445, 448

(56) References Cited

U.S. PATENT DOCUMENTS

| | | | |
|---|---|---|---|
| 5,360,753 | * | 11/1994 | Park et al. . |
| 5,395,790 | * | 3/1995 | Lur . |
| 5,498,566 | * | 3/1996 | Lee . |
| 5,811,315 | * | 9/1998 | Yindeepol et al. . |
| 5,911,109 | * | 6/1999 | Razouk et al. . |
| 6,027,984 | * | 2/2000 | Thakur et al. . |
| 6,087,241 | * | 7/2000 | St. Amand et al. . |

* cited by examiner

Primary Examiner—John F. Niebling
Assistant Examiner—Josetta I. Jones

(57) ABSTRACT

A method for fabrication a shallow trench isolation (STI) structure by combining uses of a STI process and a local oxidation (LOCAS) process is provided. The method includes forming a first liner oxide layer over a substrate, on which a patterned hard material layer is formed. A hard spacer is formed on each sidewall of the hard material layer. A LOCOS structure is formed on the substrate other than the hard spacer and the hard material layer. Then, the hard spacer is removed to expose a portion of the pad oxide on the substrate. A trench is formed in the substrate on each side of the LOCOS structure. A conformal second liner oxide layer is formed on the inner surface of the trench. The trench is filled with a polysilicon layer, having a surface higher than the substrate surface. A second thermal process is performed to oxidize the polysilicon layer so as to merge the LOCOS structure to cover the surface of the polysilicon layer. The hard material layer is removed to form the isolation structure of the invention.

13 Claims, 4 Drawing Sheets

METHOD FOR FABRICATING AN ISOLATION STRUCTURE INCLUDING A SHALLOW TRENCH ISOLATION STRUCTURE AND A LOCAL-OXIDATION ISOLATION STRUCTURE

BACKGROUND OF THE INVENTION

1. Field of the Invention

This invention relates to semiconductor fabrication, and more particularly to a method for fabricating an isolation structure including a shallow trench isolation (STI) structure with a local oxidation (LOCOS) isolation structure.

2. Description of Related Art

A device isolation structure is generally used to prevent carriers, such as electrons or electron-holes from drifting between two adjacent devices. Conventionally, isolation structures are formed between field effect transistors FETs, which usually are densely formed, so as to prevent a charge leakage of the FETs from occurring. These densely formed FETs can be, for example, a dynamic random access memory (DRAM) device. The isolation structures usually include several field oxide (FOX) structures distributed on a substrate surface. The FOX layers typically are formed by a local oxidation (LOCOS) method on the substrate surface.

FIG. 1 is a cross-sectional view of a conventional LOCOS structure with isolated FETs on a portion of a semiconductor substrate. In FIG. 1, on a substrate 100, a FET 104 and a FET 106 are isolated by a FOX structure 102. Each of the FETs 104, 106 typically includes a gate on the substrate, a source region on one side of the gate in the substrate 100, and a drain region on the other side of the gate in the substrate 100. The FETs 104, 106 belong to a part of a memory device, which also includes a capacitor and interconnects (not shown).

The FOX structure 102 can be formed by a LOCOS process before the FETs 104, 106 are formed. The FOX structure 102 is typically formed by sequentially forming an oxide layer (not shown) and a silicon nitride layer (not shown) over the substrate 100. The silicon nitride layer is patterned to expose a portion of the oxide layer, on which the FOX structure 102 is desired to form later. A LOCOS process is performed to oxide the exposed oxide layer so as to form the FOX structure 102 on the substrate 100. Since the silicon nitride layer does not absorb oxidant, such water vapor, the portion covered by the silicon nitride layer is not oxidized so as to provide an active area for forming the FETs 104, 106. After removing the oxide layer, the FOX structure 102 is formed on the substrate 100. This process is called LOCOS process. However, oxidant can enter the rim region of the silicon nitride layer to form a bird's beak structure 108, which is well known structure in the LOCOS process.

The bird's beak structure 108 consumes an available area for forming a memory cell, and the bird's beak structure 108 by itself has a poor isolation performance due to its small thickness. The FOX structure 102 formed by LOCOS process is not a good isolation structure for device with high integration, such as a memory device.

Another type of isolation structure called a shallow trench isolation (STI) structure is proposed to solve the problems of the FOX structure 102. FIGS. 2A–2F are cross-sectional views, schematically illustrating a conventional fabrication processes for fabricating a STI structure. In FIG. 2A, a pad oxide layer 202 is formed on a semiconductor substrate 200 to protect the substrate surface. A silicon nitride layer 204 is formed by chemical vapor deposition (CVD) on the pad oxide layer 202. A photoresist layer 208 with a pattern is formed on the silicon nitride 204. In FIG. 2B, using the photoresist layer 208 as an etching mask, the silicon nitride layer 204, the pad oxide layer 202, and the substrate 200 are etched to form a trench 210 in the substrate 210.

In FIG. 2C, after removing the photoresist layer 208, a silicon oxide layer 212 is formed over the substrate 200 so as to fill the trench 210. In FIG. 2D, using the silicon nitride layer 204 as a polishing stop point, a chemical mechanical polishing (CMP) process is performed to polish the silicon oxide layer 212 so that the silicon nitride layer 204 is exposed. A silicon oxide layer 212a remaining in the trench 210 of FIG. 2B forms a trench oxide plug. During the CMP process, since the silicon oxide layer 212a is softer than the silicon nitride layer 204, the silicon oxide layer 212a has a dishing effect 214 due to its polishing rate is faster. In FIG. 2E, the silicon nitride layer 204 is removed but the silicon oxide layer 212a remains. In FIG. 2F, the pad oxide layer 202 is etched away by a hydrofluoric (HF) acid solution. A top portion of the silicon oxide layer 212a is also etched. In this current structure, an over etching usually occurs at the upper corners of the silicon oxide layer 212a abutting the substrate 200 to form a shoulder 216. The shoulder 216 may cause a poor quality of a gate oxide layer formed subsequently and results in a decrease of the threshold voltage, which may further induce a kink effect due to an abnormal sub-threshold current.

Moreover, since the silicon oxide layer 212a is polished in the CMP process, a microscratch usually occurs on the top surface of the silicon oxide layer 212a. The dishing effect, the kink effect, and the microscratch may cause a problem of the device performance. Therefore, the STI structure still has its drawbacks for serving as an isolation structure.

SUMMARY OF THE INVENTION

It is therefore an objective of the present invention to provide a method for forming an isolation structure with a solution to reduce the bird's beak structure of a LOCOS FOX structure.

It is another an objective of the present invention to provide a method for forming an isolation structure with a solution to reduce the dishing effect, the kink effect, and the microscratch in a STI structure.

In accordance with the foregoing and other objectives of the present invention, an improved method for fabricating an isolation structure by using both a STI process and a LOCOS process is provided. The improved method includes forming a first liner oxide layer over a substrate, on which a patterned hard material layer is formed. A hard spacer is formed on each sidewall of the hard material layer. A first thermal process is performed to form a LOCOS structure on the substrate other than the hard spacer and the hard material layer. Then, the hard spacer is removed so that a portion of the pad oxide on the substrate is exposed. A trench is formed in the substrate between the hard material layer and the LOCOS structure. A conformal second liner oxide layer is formed on the inner surface of the trench. The trench is preferably filled with a polysilicon layer, having a surface about as high as the substrate surface or higher. A second thermal process is performed to oxidize the polysilicon layer so as to merge the LOCOS structure to cover the surface of the polysilicon layer. The hard material layer is removed to form the isolation structure of the invention.

In accordance with the foregoing and other objectives of the present invention, an improved isolation structure including a STI structure and a LOCOS structure is provided. A LOCOS structure is located on a substrate surface. A trench is located on each side of the LOCOS structure. A liner oxide layer is located on the inner surface of the trench. A polysilicon plug fills in the trench. An isolation layer together with the LOCOS structure covers the polysilicon plug. Thus, the improved isolation structure includes the STI structure and the LOCOS structure.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

In a conventional fabrication process, a field oxide (FOX) layer formed by a local oxidation (LOCOS) process has a bird's beak structure, which deteriorates it isolation capability. In addition, even though a shallow trench isolation (STI) structure has no bird's beak structure, it has dishing effect, kink effect, and microscratch, all of which may degrade the device performance. The device liability is decreased.

The invention provides a method for fabricating an isolation structure with combining uses of the STI process and the LOCOS process in order to solve the conventional above problems. The method of the invention is also very suitable for a semiconductor fabrication at a level of less than 025 microns.

Figure 1A:
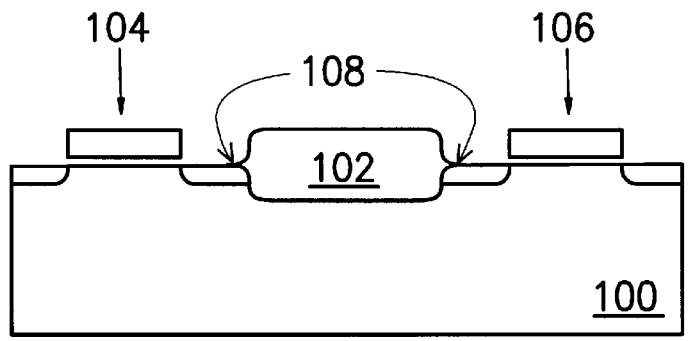
FIG. 1A is a cross-sectional view of a conventional LOCOS structure with isolated field effect transistors on a portion of a semiconductor substrate.
Figure 2A:
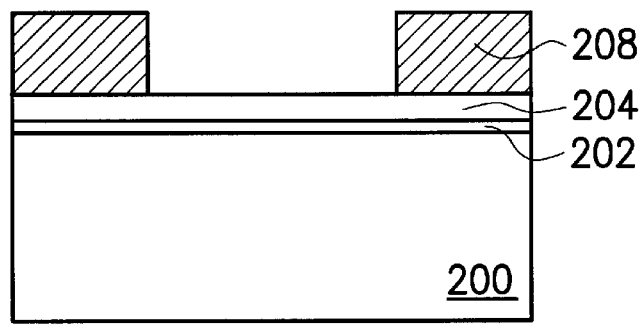
FIGS. 2A–2F are cross-sectional views, schematically illustrating a conventional fabrication process for fabricating a STI structure.
Figure 2B:
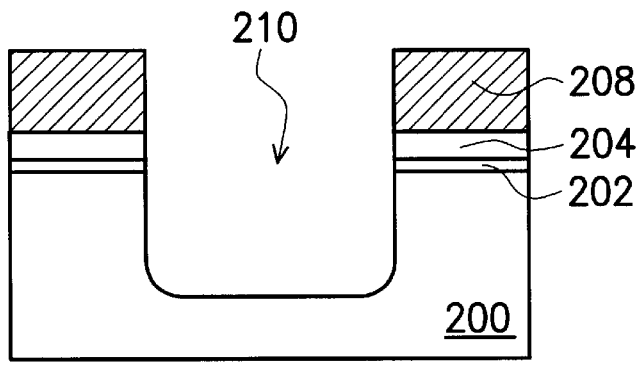
Figure 2C:
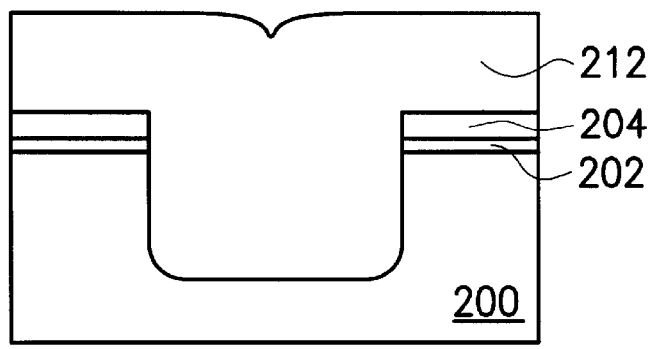
Figure 2D:
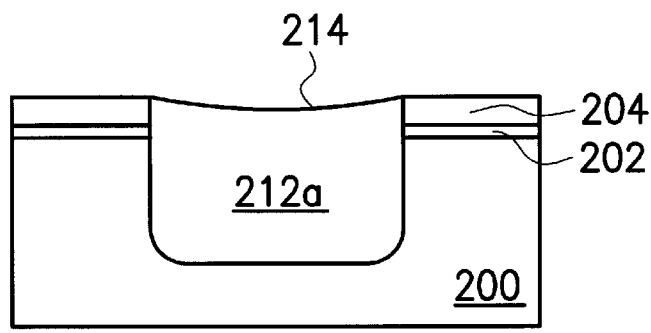
Figure 2E:
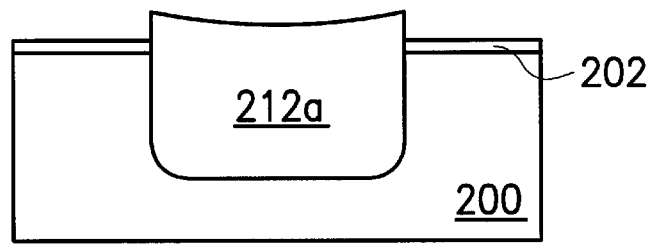
Figure 2F:
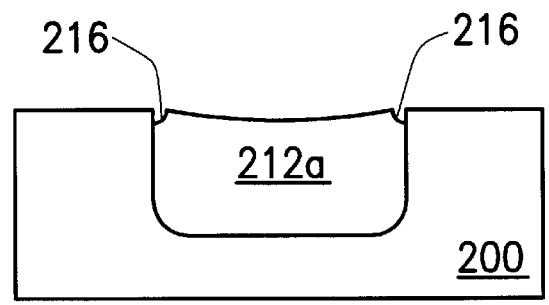
Figure 3A:
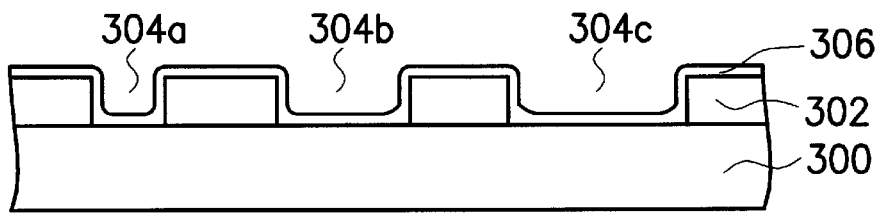
FIGS. 3A–3H are cross-sectional views, schematically illustrating fabrication processes of an improved isolation structure, according to a preferred embodiment of the invention.

FIGS. 3A–3H are cross-sectional views, schematically illustrating an improved fabrication process for fabricating an isolation structure, according to a preferred embodiment of the invention. In FIG. 3A, a hard material layer 302 is formed on a semiconductor substrate 300 by, for example, chemical vapor deposition (CVD). The substrate 300 includes, for example, silicon. Several openings 304a, 304b, 304c are formed in the hard material layer 302 by, for example, photolithography and etching. The openings 304a, 304b, 304c expose the substrate 300. An actual opening (not shown) has a width depending on circuit design. Here the openings 304a, 304b, 304c represent three typical openings, each with different width. A liner oxide layer 306 is formed over the substrate 300 so that the liner oxide layer 306 is conformal to a top surface of the substrate 300. The formation of the liner oxide layer 306 includes, for example, CVD.

Figure 3B:
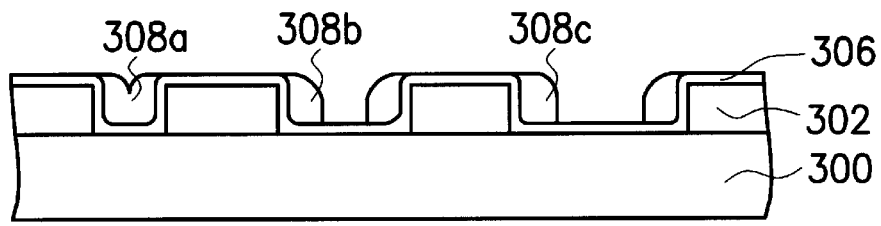

In FIG. 3B, a hard layer (not shown) is deposited over the substrate 300. An etching back process, using the liner oxide layer as an etching stop point, is performed to remove the hard layer. The etching back process includes, for example, a plasma dry etching. A selective etchant gas is also included in order to easily etch the had layer. A residue of the hard layer forms several hard spacers 308a, 308b, 308c on each sidewall of the openings 304a, 304b, 304c in the hard material layer 302. Due to a narrower width of the opening 304a of FIG. 3A, two hard spacers 308a on both sidewall of the opening 304a are merged together. Within the openings 304b, 304c of FIG. 3B, a portion of the liner oxide layer 306 is exposed.

Figure 3C:
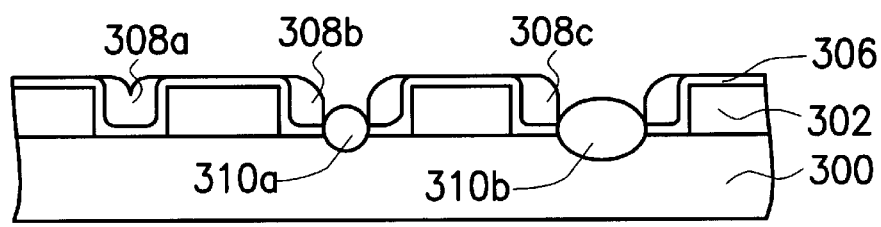

In FIG. 3C, an oxidation process is performed to form FOX layers 310a, 310b on the substrate 300. The oxidation process, for example, is a LOCOS process, which is performed by putting the substrate 300 in a furnace filled with water vapor so as to oxidize the substrate through the liner oxide layer 306. Since the hard material layer 302 and the hard spacers 308a, 308b, 308c include no silicon, the oxidation effect does not occur on them.

Figure 3D:
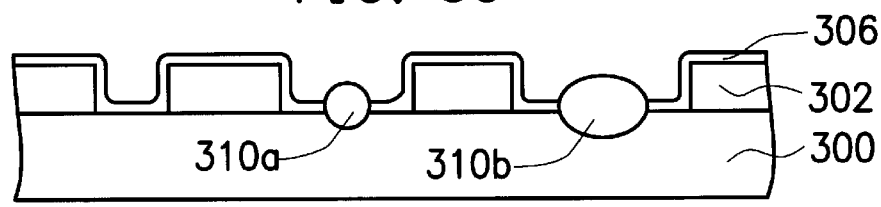

In FIG. 3D, the hard spacers 308a, 308b, 308c are removed by, for example, wet etching. If the hard spacers 308a, 308b, 308c are made of silicon nitride, a hot phosphoric acid ($H_3PO_4$) solution can be used as an etchant. After the hard spacers 308a, 308b, 308c are removed, the liner oxide layer 306 other than a portion of the FOX layers 310a, 310b is exposed again. So, the FOX layers 310a, 310b are formed on the substrate 300 by the LOCOS process.

Figure 3E:
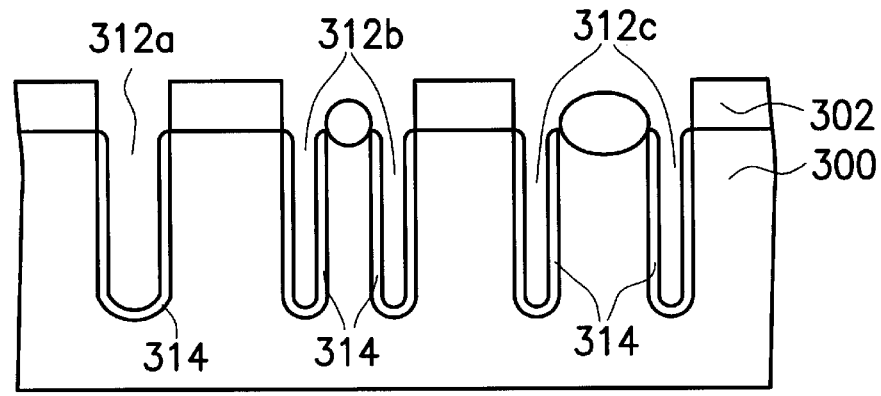
Figure 3F:
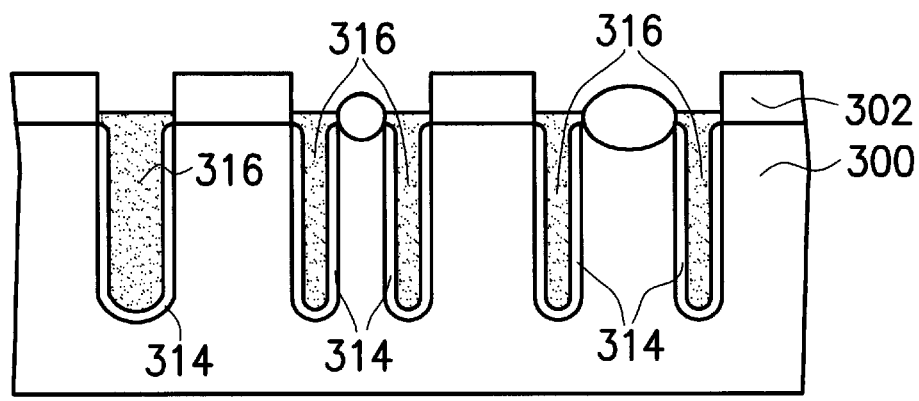

In FIG. 3E, a STI process is to be performed. Several trenches 312a, 312b, 312c are formed in the substrate 300 by, for example, an anisotropic etching process, in which the hard material layer 302 and the FOX layers 310a, 310b are used as an etching mask. The liner oxide layer 306 is also removed. Two trenches 312b are located on each side of the FOX layer 310a of FIG. 3D, and two trenches 312c are located on each side of the FOX layer 310b of FIG. 3D. The trench 312a is located within the opening 304a of FIG. 3A since there is no FOX layer formed in the opening 312a due to its narrow width. A liner oxide layer 314 conformal to the inner surface of the trenches 312a, 312b, 312c is formed by, for example, thermal oxidation. A polysilicon layer (not shown) is formed over the substrate 300 to fill the trenches 312a, 312b, 312c and an etching back process, using the FOX layers 310a, 310b of FIG. 3D as an etching stop point, is performed to remove a top portion of the polysilicon layer so as to form a polysilicon layer 316 in the trenches 312a, 312b, 312c. The top surface of the polysilicon layer 316 is preferably at least about as high as the surface of the substrate 300. The FOX layers 310a, 310b are exposed. Since the polysilicon layer 316 includes silicon, which can be easily oxidized to form silicon oxide for a purpose of isolation. The polysilicon layer 316 can be replaced by other materials including silicon.

Figure 3G:
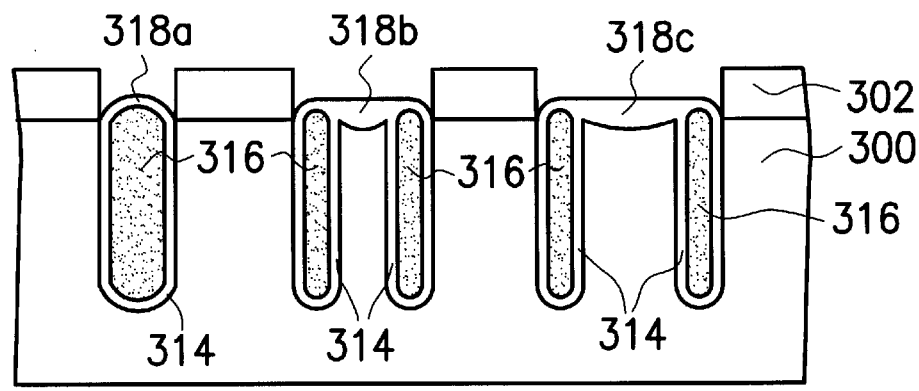

In FIG. 3G, a thermal oxidation process is performed to oxidize the polysilicon layer 316, in which the FOX layers 310a, 310b of FIG. 3D may be further extended. Thus, several FOX layers 318a, 318b, 318c are formed to cover the polysilicon layer 316. The FOX layer 318b and the FOX layer 318c respectively merge the original FOX layer 310a and the original FOX layer 310b. The FOX layer 318a is newly formed because there is no original FOX layer.

Figure 3H:
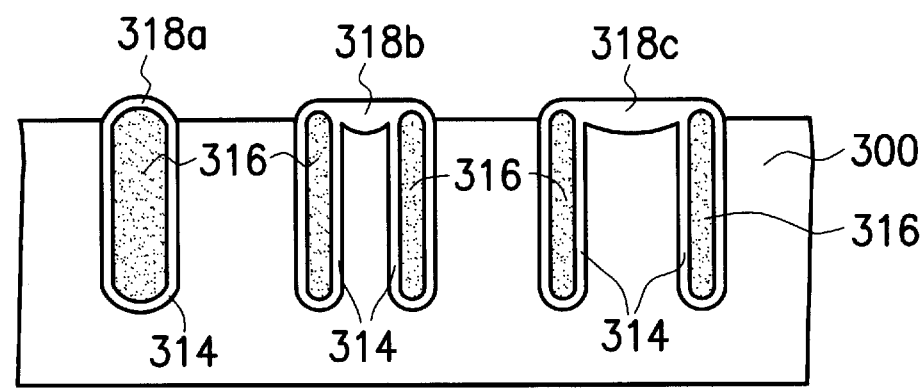

In FIG. 3H, the hard material layer 302 is removed by, for example, wet etching so as to expose the substrate 300 other than the portion of the FOX layers 318a, 318b, 318c. The polysilicon layer 316 is fully enclosed by the liner oxide layer 314 and the FOX layers 318a, 318b, 318c. Three types of polysilicon STI structures are formed. The one under the FOX layer 318a is a single-trench structure. The other two under the FOX layer 318b and the FOX layer 318c are a double-trench structure.

In conclusion, the isolation structure of the invention includes a polysilicon STI structure in the substrate. The polysilicon STI structure includes an original FOX layer is first formed on the substrate. A trench is formed in the substrate on each side of the FOX layer. A liner oxide layer is formed on the inner surface of the trench. A polysilicon layer fills the trench. A FOX layer is formed to cover the polysilicon layer, in which the FOX layer merges the original FOX layer. The polysilicon STI structure is also formed by including the LOCOS process to form the FOX layer and the original FOX layer.

Several characteristics of the invention therefore are following:

1. The polysilicon STI structure includes no CMP process so that the dishing effect, the kink effect, and the microscratch do not occur. Since the polysilicon STI structure is also based on a STI structure, the method of the invention is suitable for a fabricating dimension less than a level of 0.25 microns.

2. Since there is no pad oxide layer between the hard material layer 302 and the substrate 300, the FOX layer can be formed over the filled polysilicon layer without a bird's beak structure.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating an improved shallow trench isolation (STI) structure by combining uses of a STI process and a local oxidation (LOCOS) process, the method comprising:

forming a hard material layer on a semiconductor substrate;

patterning the hard material layer to form an opening, which exposes a region of the substrate, wherein the improved STI structure is to be found in the exposed region in the substrate;

forming a first liner oxide layer over the substrate so that the first liner oxide layer is conformal to a substrate surface;

forming a hard spacer on each sidewall of the opening of the hard material layer, wherein a portion of the first liner oxide layer at a bottom surface of the opening is still exposed;

forming a first field oxide (FOX) layer on the exposed portion of the first liner oxide layer;

removing the hard spacer;

forming a trench in the substrate, using the hard material layer and the FOX layer as a mask, so that the trench is formed at each side of the FOX layer within a region of the opening of the hard material layer.

forming a second liner oxide layer over an inner surface of the trench;

filling the trench with a polysilicon layer, etching back the polysilicon layer to expose a top surface of the first field oxide layer;

forming a second FOX layer over the polysilicon layer to merge the second liner oxide layer and the first FOX layer so that the polysilicon layer is fully isolated from the substrate; and removing the hard material layer to expose the substrate.

2. The method of claim 1, wherein the hard material comprises silicon nitride.

3. The method of claim 1, wherein the step of forming the first FOX layer comprises a thermal oxidation process.

4. The method of claim 1, wherein the step of forming the second FOX layer comprises a thermal oxidation process.

5. The method of claim 1, wherein the step of forming the first liner oxide layer comprises a chemical vapor deposition (CVD) process.

6. The method of claim 1, wherein the hard spacer comprises silicon nitride.

7. The method of claim 1, wherein the step of removing the hard spacer comprises wet etching.

8. The method of claim 1, wherein the step of forming the second liner oxide layer comprises a thermal oxidation process.

9. A method for fabricating an improved shallow trench isolation (STI) structure by combining uses of a STI process and a local oxidation (LOCOS) process, the method comprising:

forming a hard material layer on a semiconductor substrate;

patterning the hard material layer to form an opening, which exposes a region of the substrate, wherein the improved STI structure is to be formed in the exposed region in the substrate;

forming a first liner oxide layer over the substrate so that the first liner oxide layer is conformal to a substrate surface;

forming a hard spacer on each sidewall of the opening of the hard material layer;

performing a first thermal process over the substrate;

removing the hard spacer;

forming a trench in the substrate at the portion, where is originally covered by the hard spacer;

forming a second liner oxide layer over an inner surface of the trench;

filling the trench with a polysilicon layer, etching back the polysilicon layer to expose a top surface of the first field oxide layer;

performing a second thermal process over the substrate to form an isolation layer over the polysilicon so as to fully isolate the polysilicon layer from the substrate; and removing the hard material layer.

10. The method of claim 9, wherein the hard material layer comprises silicon nitride.

11. The method of claim 9, wherein the hard spacer comprises silicon nitride.

12. The method of claim 9, wherein the polysilicon layer in the trench has a top surface at least about as high as the substrate surface.

13. The method of claim 9, wherein the step of performing the first thermal process comprises a formation of a field oxide (FOX) layer on the substrate within the opening of the hard material layer.

* * * * *